(12) United States Patent
Kusumoto

(10) Patent No.: US 11,133,425 B2
(45) Date of Patent: Sep. 28, 2021

(54) SOLAR CELL

(71) Applicant: Panasonic Intellectual Property Management Co., Ltd., Osaka (JP)

(72) Inventor: Shohei Kusumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 57 days.

(21) Appl. No.: 16/377,917

(22) Filed: Apr. 8, 2019

(65) Prior Publication Data
US 2019/0363202 A1 Nov. 28, 2019

(30) Foreign Application Priority Data

May 28, 2018 (JP) .............................. JP2018-101835

(51) Int. Cl.
*H01L 31/0224* (2006.01)
*H01L 51/44* (2006.01)

(52) U.S. Cl.
CPC .... *H01L 31/022425* (2013.01); *H01L 51/441* (2013.01)

(58) Field of Classification Search
None
See application file for complete search history.

(56) References Cited

PUBLICATIONS

Li, Wenzhe et al., "Addictive-assisted construction of all-inorganic CsSnIBr2 mesoscopic perovskite solar cells with superior thermal stability up to 473 K"; J. Mater. Chem. A. 4, pp. 17104-17110. (Year: 2016).*

Lee, Seon Joo et al., "Fabrication of Efficient Formamidinium Tin Iodide Perovskite Solar Cells through SnF2-Pyrazine Complex", Journal of the American Chemical Society, 2016, 138, 3974-3977. (Year: 2016).*

Mulmudi Hemant Kumar et al., "Lead-Free Halide Perovskite Solar Cells with High Photocurrents Realized Through Vacancy Modulation" Advanced Materials, 2014, 26, pp. 7122-7127, Sep. 11, 2014.

Yuhei Ogomi, "Trap distribution analysis for thermal stimulation current of tin-based perovskite thin film", Grants-in-Aid for Scientific Research Research Result Report, Grant No. 15K21224, Jun. 23, 2017.

* cited by examiner

*Primary Examiner* — Tamir Ayad
(74) *Attorney, Agent, or Firm* — McDermott Will and Emery LLP

(57) ABSTRACT

Provided is a solar cell, comprising a first electrode having a light-transmissive property, a second electrode, a light-absorbing layer located between the first electrode and the second electrode, and an intermediate layer located between the first electrode and the light-absorbing layer. The light-absorbing layer contains a fluorine compound and a perovskite compound which is represented by a chemical formula $ASnX_3$ (where A is a monovalent cation and X is a halogen anion). The intermediate layer contains at least one selected from the group consisting of a metal oxide, a metal sulfide, a metal chalcogenide, and a metal nitride. An upper surface of the intermediate layer is in contact with a lower surface of the light-absorbing layer. A molar ratio of fluorine atoms to the perovskite compound is not less than 49% at an interface between the light-absorbing layer and the intermediate layer.

15 Claims, 2 Drawing Sheets

SOLAR CELL

BACKGROUND

1. Technical Field

The present disclosure relates to a solar cell.

2. Description of the Related Art

Recently, a perovskite solar cell has been researched and developed. In the perovskite solar cell, a perovskite compound represented by a chemical formula $ABX_3$ (where A is a monovalent cation, B is a divalent cation, and X is a halogen anion) is used as a light-absorbing material.

Non-Patent Literature 1 discloses that a perovskite compound represented by the chemical formula $CsSnI_3$ is used as a light-absorbing material of a perovskite solar cell. Furthermore, Non-Patent Literature 1 discloses that $TiO_2$ and an organic semiconductor referred to as Spiro-OMETAD are used as an electron transport material and a hole transport material, respectively.

CITATION LIST

Non-Patent Literature

Non-Patent Literature 1: Mulmudi Hemant Kumar et al., "Lead-Free Halide Perovskite Solar Cells with High Photocurrents Realized Through Vacancy Modulation", Advanced Materials, 2014, 26, 7122-7127

SUMMARY

An object of the present disclosure is to provide a tin perovskite solar cell in which the conversion efficiency thereof is further improved.

The solar cell according to the present disclosure comprises:
  a first electrode having a light-transmissive property;
  a second electrode;
  a light-absorbing layer located between the first electrode and the second electrode; and
  an intermediate layer located between the first electrode and the light-absorbing layer, wherein
  the light-absorbing layer contains a fluorine compound and a perovskite compound which is represented by a chemical formula $ASnX_3$ (where A is a monovalent cation and X is a halogen anion);
  the intermediate layer contains at least one selected from the group consisting of a metal oxide, a metal sulfide, a metal chalcogenide, and a metal nitride;
  an upper surface of the intermediate layer is in contact with a lower surface of the light-absorbing layer; and
  a molar ratio of fluorine atoms to the perovskite compound is not less than 49% at an interface between the light-absorbing layer and the intermediate layer.

The present disclosure provides a tin perovskite solar cell in which the conversion efficiency thereof is further improved.

DETAILED DESCRIPTION OF THE EMBODIMENT

Definition of Terms

The term "perovskite compound" used in the present specification means a perovskite crystal structure represented by a chemical formula $ABX_3$ (where A is a monovalent cation, B is a divalent cation, and X is a halogen anion) and a structure having a crystal similar thereto.

The term "tin perovskite compound" used in the present specification means a perovskite compound containing tin.

The term "tin perovskite solar cell" used in the present specification means a solar cell including the tin perovskite compound as a light-absorbing material.

Embodiment of Present Disclosure

Hereinafter, the embodiment of the present disclosure will be described in more detail with reference to the drawings.

First Embodiment

Figure 1:
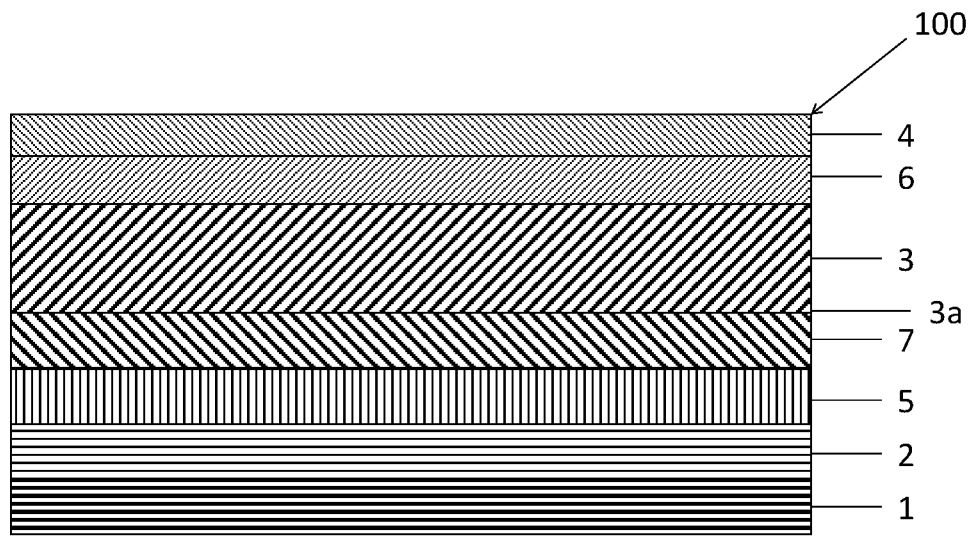
FIG. 1 shows a cross-sectional view of a solar cell according to the first embodiment of the present disclosure.

FIG. 1 shows a cross-sectional view of a solar cell 100 according to the first embodiment. As shown in FIG. 1, the solar cell 100 according to the first embodiment comprises a first electrode 2, a second electrode 4, a light-absorbing layer 3, and an intermediate layer 7.

The light-absorbing layer 3 is located between the first electrode 2 and the second electrode 4. The first electrode 2 faces the second electrode 4 in such a manner that the light-absorbing layer 3 is disposed between the first electrode 2 and the second electrode 4. The first electrode 2 has light-transmissive property. In the present specification, "the electrode has light-transmissive property" means that 10% or more of light having a wavelength of not less than 200 nanometers and not more than 2,000 nanometers travels through the electrode at any wavelength.

The intermediate layer 7 is located between the first electrode 2 and light-absorbing layer 3.

The solar cell 100 shown in FIG. 1 further comprises a substrate 1, an electron transport layer 5, and a hole transport layer 6. The solar cell 100 does not have to have the substrate 1. The electron transport layer 5 is located between the intermediate layer 7 and the light-absorbing layer 3. As will be described in the second embodiment, the intermediate layer 7 may double as the electron transport layer 5. The hole transport layer 6 is located between the light-absorbing layer 3 and the second electrode 4. The solar cell 100 does not have to have the hole transport layer 6.

Since the first electrode 2 has light-transmissive property, light reaches the light-absorbing layer 3 through the first electrode 2.

(Light-Absorbing Layer 3)

The light-absorbing layer 3 contains a perovskite compound represented by a chemical formula $ASnX_3$ (where A is a monovalent cation and X is a halogen anion) as the light-absorbing material. The monovalent cation located at the A site is not limited. An example of the monovalent cation is an organic cation or an alkali metal cation. An example of the organic cation is a methylammonium cation (i.e., $CH_3NH_3^+$), a formamidinium cation (i.e., $NH_2CHNH_2^+$), a phenethylammonium cation (i.e., $C_6H_5CH_2CH_2NH_3^+$), or a guanidinium cation (i.e., $CH_6N_3^+$). An example of the alkali metal cation is a cesium cation (i.e., $Cs^+$). It is desirable that the monovalent cation located at the A site is a formamidinium cation. The monovalent cation located at the A site may be composed of two or more kinds of the cations. An example of the halogen anion located at the X site is an iodide ion. The halogen anion located at the X site may be composed of two or more kinds of the halogen ions.

The light-absorbing layer 3 further contains a fluorine compound. The fluorine compound is not limited. An example of the fluorine compound is a metal fluoride. An example of the metal fluoride is $SnF_2$, $SnF_4$, MgF, NaF or KF.

The light-absorbing layer 3 contains the perovskite compound represented by the chemical formula $ASnX_3$ and the fluorine compound, as described above. The sentence "The light-absorbing layer 3 contains the perovskite compound represented by the chemical formula $ASnX_3$" means that the light-absorbing layer 3 contains 70 mass percent or more of the perovskite compound represented by the chemical formula $ASnX_3$. For example, the light-absorbing layer 3 may contain 80 mass percent or more of the perovskite compound. The light-absorbing layer 3 may contain impurities. The light-absorbing layer 3 may contain a compound other than the perovskite compound represented by the chemical formula $ASnX_3$ and the fluorine compound.

The light-absorbing layer 3 has a thickness of, for example, not less than 100 nanometers and not more than 10 micrometers. The light-absorbing layer 3 may have a thickness of not less than 100 nanometers and not more than 1,000 nanometers. The thickness of the light-absorbing layer 3 may depend on the magnitude of the light-absorbing of the light-absorbing layer 3. The light-absorbing layer 3 may be formed by an application method using a solution.

(Intermediate Layer 7)

The intermediate layer 7 contains a metal oxide, a metal sulfide, a metal chalcogenide, or a metal nitride.

An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable.

Another example of the metal oxide is a perovskite oxide. An example of the perovskite oxide is $SrTiO_3$ or $CaTiO_3$.

An example of the metal sulfide is CdS, ZnS, $In_2S_3$, SnS, PbS, $Mo_2S$, $WS_2$, $Sb_2S_3$, $Bi_2S_3$, $ZnCdS_2$, or $Cu_2S$.

An example of the metal chalcogenide is CdSe, CsSe, $In_2Se_3$, $WSe_2$, HgSe, SnSe, PbSe, or CdTe. In other words, the term "chalcogenide" means a selenide and a telluride in the present specification.

An example of the metal nitride is GaN or TaN.

The intermediate layer 7 may have a thickness of not less than 0.01 micrometer and not more than 10 micrometers, or not less than 0.1 micrometer and not more than 1 micrometer. The intermediate layer 7 may have a large surface roughness. In particular, a surface roughness coefficient defined by a value of an effective area/a projected area may be not less than 10, or not less than 100. The effective area is an actual area of a surface of the object. The projected area is an area of a shadow of an object formed posteriorly to the object when light travelling from the front of the object is incident on the object. The effective area can be calculated from a volume calculated from the projected area and the thickness of the object, a specific surface area of the material which constitutes the object, and a bulk density of the object. The specific surface area is measured, for example, by a nitrogen adsorption method.

In the solar cell 100 according to the first embodiment, an interface 3a is formed between the light-absorbing layer 3 and the intermediate layer 7. In more detail, a lower surface of the light-absorbing layer 3 and an upper surface of the intermediate layer 7 are in contact with each other. The interface 3a is formed therebetween. Needless to say, the light-absorbing layer 3 has two principal surfaces (namely, an upper surface and the lower surface). The lower surface of the light-absorbing layer 3 means a principal surface which is in contact with the intermediate layer 7 (i.e., a principal surface which faces the first electrode 2). Similarly, the intermediate layer 7 also has two principal surfaces (namely, an upper surface and the lower surface). The upper surface of the intermediate layer 7 is a principal surface which is in contact with the light-absorbing layer 3 (namely, a principal surface which faces the second electrode 4).

In the solar cell 100 according to the first embodiment, a molar ratio of fluorine atoms to the perovskite compound at the interface 3a is a high value of not less than 0.49.

The molar ratio is calculated on the basis of the following mathematical formula (1) from measurement results measured by an X-ray photoelectron spectroscopy method (hereinafter, referred to as "XPS method").

Molar ratio=(the number of the moles of the fluorine atoms in an interval d2)/{the number of the moles of halogen anions (e.g., iodide ions) included in the perovskite compound contained in the light-absorbing layer 3}/3}  (1)

Figure 3:
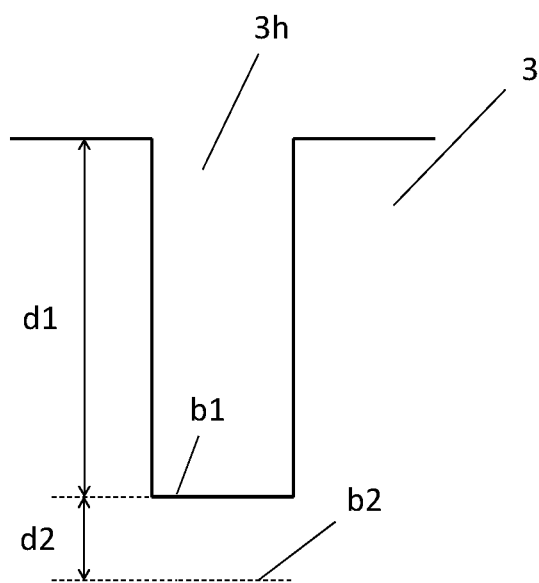
FIG. 3 shows a cross-sectional view of the solar cell in which a hole having a depth of d1 is formed in a light-absorbing layer.

As shown in FIG. 3, a hole 3h having a depth of d1 is formed in the light-absorbing layer 3 by etching, and then, the composition of the elements included in an interval d2 is measured with an X-ray photoelectron spectroscopy measurement device. The interval d2 is a distance between the bottom b1 of the hole 3h and a position b2 located more deeply than the bottom b1. When the molar ratio at the interface 3a is measured, the depth d1 is approximately equal to the thickness of the light-absorbing layer 3. The value of the interval d2 is dependent on the performance of the X-ray photoelectron spectroscopy measurement device.

For a detail method for calculating the molar ratio, see also the examples which will be described later.

The high molar ratio of not less than 0.49 means that defect density of tin at the interface 3a is low. For this reason, the solar cell 100 according to the first embodiment has higher conversion efficiency than a conventional perovskite solar cell.

The molar ratio may be not more than 0.75. The molar ratio may be not less than 0.502 and not more than 0.663. The solar cell having such a molar ratio has higher conversion efficiency than a conventional perovskite solar cell.

The intermediate layer 7 may be porous. In other words, the intermediate layer 7 may be formed of a porous body. An example of the porous body is a porous body in which a plurality of particles each formed of the above-mentioned metal oxide, metal sulfide, or metal chalcogenide are connected to one another.

The pore included in the intermediate layer 7 formed of the porous body communicates from a part in contact with the first electrode 2 to a part in contact with the electron transport layer 5. The pore included in the intermediate layer 7 is filled with the material of the light-absorbing layer 3. In other words, the pore is filled with at least one selected from the group consisting of the perovskite compound represented by the chemical formula $ASnX_3$ and the fluorine compound. The pore may be filled with both the perovskite compound represented by the chemical formula $ASnX_3$ and the fluorine compound. Since the first electrode 2 is in contact with the electron transport layer 5, electrons migrate directly from the electron transport layer 5 to the first electrode 2.

The intermediate layer 7 formed of the porous body causes light scattering. For this reason, length of a path of light which travel thorough the light-absorbing layer 3 may be increased. The increase in the path of light may increase amounts of the electrons and holes which are generated in the light-absorbing layer 3.

The intermediate layer 7 does not prevent the light-absorbing layer 3 from absorbing light. The intermediate layer 7 does not prevent the electrons from migrating from the light-absorbing layer 3 to the electron transport layer 5.

(Substrate 1)

The substrate 1 holds the first electrode 2, the electron transport layer 5, the light-absorbing layer 3, and the second electrode 4. The substrate 1 may be formed of a transparent material. An example of the substrate 1 is a glass substrate or a plastic substrate. An example of the plastic substrate is a plastic film. In a case where the first electrode 2 has sufficient strength, the solar cell 100 does not have to have the substrate 1, since the first electrode 2 holds the electron transport layer 5, the light-absorbing layer 3, and the second electrode 4.

(First Electrode 2 and Second Electrode 4)

The first electrode 2 has electric conductivity and light-transmissive property. The second electrode 4 has electric conductivity. The second electrode 4 may further have light-transmissive property. Light from a visible region to a near-infrared light region travels through the first electrode 2. Light from a visible region to a near-infrared light region may travel through the second electrode 4.

Each of the first electrode 2 and the second electrode 4 is formed of, for example, at least one selected from the group consisting of a metal oxide or nitride which is transparent and has electric conductivity.

An example of the metal oxide is:

(i) tin oxide doped with at least one selected from the group consisting of lithium, magnesium, niobium, and fluorine;

(ii) gallium oxide doped with at least one selected from the group consisting of tin and silicon;

(iii) indium-tin composite oxide;

(iv) tin oxide doped with at least one selected from the group consisting of antimony and fluorine; or (v) zinc oxide doped with at least one selected from the group consisting of boron, aluminum, gallium, and indium.

Two or more kinds of the metal oxides may be used in combination as a composite.

An example of the metal nitride is a gallium nitride doped with at least one selected from the group consisting of silicon and oxygen. Two or more kinds of the metal nitrides may be used in combination.

The metal oxide and the metal nitride may be used in combination.

The first electrode 2 may be formed by providing a pattern through which light passes using a non-transparent material. An example of the pattern through which the light passes is a line, a wave, a grid, or a punching metal pattern on which a lot of fine through holes are arranged regularly or irregularly. When the first electrode 2 has the above-mentioned pattern, light can travel through a part in which an electrode material is absent. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

In a case where the solar cell 100 does not comprise the hole transport layer 6, the second electrode 4 is formed of a material having an electron block property that the electrons migrating from the light-absorbing layer 3 are blocked. In this case, the second electrode 4 is not in ohmic contact with the light-absorbing layer 3. The electron block property that the electrons migrating from the light-absorbing layer 3 are blocked means that only the holes generated in the light-absorbing layer 3 are allowed to be passed; however, the electron are not allowed to be passed. The Fermi energy level of the material having the electron block property is lower than the energy level of the lower end of the conduction band of the light-absorbing layer 3. The Fermi energy level of the material having the electron block property may be lower than the Fermi energy level of the light-absorbing layer 3. An example of the material having the electron block property is platinum, gold, or a carbon material such as graphene. If the solar cell 100 comprises the hole transport layer 6, the second electrode 4 does not have to have the electron block property that the electrons migrating from the light-absorbing layer 3 are blocked.

Some of materials having electron block property that the electrons migrating from the light-absorbing layer 3 is blocked do not have the light-transmissive property. For this reason, if the second electrode 4 is formed of such materials, the second electrode 4 has the above-mentioned pattern such that light travels through the second electrode 4.

The transmissivity of the light of the first electrode 2 and the second electrode 4 may be 50% or more, or 80% or more. The wavelength of the light which travels through the electrode depends on an absorption wavelength of the light-absorbing layer 3. Each of the first electrode 2 and the second electrode 4 has a thickness of, for example, not less than 1 nanometer and not more than 1,000 nanometers.

(Electron Transport Layer 5)

The electron transport layer 5 is a dense layer containing a semiconductor. The semiconductor has a bandgap of not less than 3.0 eV. If the electron transport layer 5 contains the semiconductor having a bandgap of not less than 3.0 eV, visible light and infrared light reaches the light-absorbing layer 3. An example of the semiconductor is an organic or inorganic n-type semiconductor.

An example of the organic n-type semiconductor is an imide compound, a quinone compound, fullerene, or a derivative of fullerene. An example of the inorganic n-type semiconductor is a metal oxide, a metal nitride, or a perovskite oxde. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the metal nitride is GaN. An example of the perovskite oxide is $SrTiO_3$ or $CaTiO_3$.

The electron transport layer 5 may contain a material having a bandgap of more than 6.0 eV. An example of the material having a bandgap of more than 6.0 eV is (i) a halide of an alkali metal or alkali earth metal such as lithium fluoride or calcium fluoride, (ii) an alkali metal oxide such as magnesium oxide, or (iii) silicon dioxide. In this case, the electron transport layer 5 has a thickness of, for example, not more than 10 nanometers to ensure the electron transport property of the electron transport layer 5.

The electron transport layer 5 may include a plurality of layers formed of materials which are different from each other.

(Hole Transport Layer 6)

The hole transport layer 6 is composed of an organic substance or an inorganic semiconductor. An example of a general organic substance used for the hole transport layer 6 is 2,2',7,7'-tetrakis-(N,N-di-p-methoxyphenylamine)9,9'-spirobifluorene (hereinafter, referred to as "spiro-OMeTAD", poly[bis(4-phenyl)(2,4,6-trimethylphenyl) amine] (hereinafter, referred to as "PTAA"), poly(3-hexylthiophene-2,5-diyl) (hereinafter, referred to as "P3HT"), poly(3,4-ethylenedioxythiophene) (hereinafter, referred to as "PEDOT"), or copper phthalocyanine (hereinafter, referred to as "CuPC").

An example of the inorganic semiconductor is $Cu_2O$, $CuGaO_2$, CuSCN, CuI, $NiO_x$, $MoO_x$, $V_2O_5$, or a carbon material such as a graphene oxide.

The hole transport layer 6 may include a plurality of layers formed of materials which are different from each other.

The hole transport layer 6 may have a thickness of not less than 1 nanometer and not more than 1,000 nanometers, not less than 10 nanometers and not more than 500 nanometers, or not less than 10 nanometers and not more than 50 nanometers. If the hole transport layer 6 has a thickness of not less than 1 nanometer and not more than 1,000 nanometers, a sufficient hole transport property is achieved. Furthermore, if the hole transport layer 6 has a thickness of not less than 1 nanometer and not more than 1,000 nanometers, light is converted into electric power with high efficiency, since the hole transport layer 6 has low resistance.

The hole transport layer 6 may contain an supporting electrolyte and a solvent. The supporting electrolyte and the solvent stabilize the holes included in the hole transport layer 6.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is lithium bis(trifluoromethanesulfonyl)imide (hereinafter, referred to as "LiTFSI"), $LiPF_6$, $LiBF_4$, lithium perchlorate, or potassium tetrafluoroborate.

The solvent contained in the hole transport layer 6 may have high ionic conductivity. The solvent may be an aqueous solvent or an organic solvent. It is desirable that the solvent is an organic solvent, in light of stabilization of the solute. An example of the organic solvent is tert-butyl pyridine, pyridine, or a heterocyclic compound such as n-methylpyrrolidone.

The solvent contained in the hole transport layer 6 may be an ionic liquid. The ionic liquid may be used solely or in combination of another solvent. The ionic liquid is desirable in light of low volatility and high flame resistance.

An example of the ionic liquid is an imidazolium compound such as 1-ethyl-3-methylimidazolium tetracyanoborate, a pyridine compound, an alicyclic amine compound, an aliphatic amine compound, or an azonium amine compound.

The position of the electron transport layer 5 and the position of the hole transport layer 6 may be exchanged.

(Fundamental Function Effect of Solar Cell 100)

Next, the fundamental function effect of the solar cell 100 will be described. When the solar cell 100 is irradiated with light, the light-absorbing layer 3 absorbs the light to generate excited electrons and holes. The excited electrons migrate to the electron transport layer 5. On the other hand, the holes generated in the light-absorbing layer 3 migrate to the hole transport layer 6. The electron transport layer 5 and the hole transport layer 6 are electrically connected with the first electrode 2 and the second electrode 4, respectively. Electric current is taken out from the first electrode 2 and the second electrode 4 which serves as the anode and the cathode, respectively.

(Findings which Established the Foundation of the Present Disclosure)

The findings which established the foundation of the present disclosure will be described below.

Theoretically, the tin perovskite solar cell has high conversion efficiency. However, since tin perovskite compound has high defect density, actually, the tin perovskite solar cell has low conversion efficiency. Non-patent Literature 1 discloses that the reason why the tin perovskite solar cell has low conversion efficiency is that the defect density of tin included in the tin perovskite compound is high. Non-patent Literature 1 further discloses that tin fluoride is used as a dopant to decrease the defect density of tin included in the tin perovskite compound. The tin perovskite compound is prepared with a solution containing tin fluoride and a precursor of the tin perovskite compound to decrease the defect density of tin included in the tin perovskite compound.

The conversion efficiency of the tin perovskite solar cell relates closely to the defect density of tin at an interface between the light-absorbing layer containing the tin perovskite compound and a layer which is adjacent to the light-absorbing layer. The defect density at the interface is required to be decreased to improve the conversion efficiency of the tin perovskite solar cell. However, there is a limit to the decrease in the defect density of tin at the interface between the light-absorbing layer containing the tin perovskite compound and the layer which is adjacent to the light-absorbing layer by the method using the solution containing tin fluoride and the precursor of the tin perovskite compound. Since tin fluoride is insulative, there is a problem that tin fluoride prevents the electrons and holes contained in the light-absorbing layer from migrating, if the concentration of tin fluoride contained in the light-absorbing layer is too high.

As just described, the defect density at the interface 3a between the light-absorbing layer 3 and the intermediate layer 7 is further decreased to improve the conversion efficiency of the tin perovskite solar cell. As demonstrated in the examples which will be described later, in the present disclosure, since the molar ratio of the fluorine atoms to the perovskite compound at the interface 3a is not less than 49%, the defect density at the interface 3a is decreased. As a result, the solar cell 100 according to the present disclosure has high conversion efficiency.

(Production Method of Solar Cell 100)

The solar cell 100 can be produced, for example, by the following method. First, the first electrode 2 is formed on the surface of the substrate 1 by a chemical vapor deposition method (hereinafter, referred to as "CVD method") or a sputtering method. Next, the electron transport layer 5 is formed on the first electrode 2 by a sputtering method.

Next, the intermediate layer 7 is formed on the electron transport layer 5.

The intermediate layer 7 is formed on the electron transport layer 5. First, powder of the metal oxide, the metal sulfide, or the metal chalcogenide is dispersed in a dispersion medium to prepare a paste. An example of the dispersion medium is ethyl cellulose. The prepared paste is applied on the electron transport layer 5 by an application method, and then sintered to form the intermediate layer 7.

The intermediate layer 7 formed of the porous body facilitates the formation of the light-absorbing layer 3. The material of the light-absorbing layer 3 enters the inside of the pore of the intermediate layer 7. For this reason, the possibility that the material of the light-absorbing layer 3 is repelled or aggregated on the surface of the intermediate layer 7 is lowered. The intermediate layer 7 is a foothold of the light-absorbing layer 3. The intermediate layer 7 allows the light-absorbing layer 3 to be formed as a uniform film. The light-absorbing layer 3 may be formed by applying a solution on the intermediate layer 7 by a spin-coat method, and then, heating.

The light-absorbing layer 3 may be formed by the following method. As one example, a formation method of the light-absorbing layer 3 containing the fluorine compound and the perovskite compound represented by the chemical formula $(HC(NH_2)_2)_{1-x}(C_6H_5CH_2CH_2NH_3)_xSnI_3$ (where $0<x<1$, hereinafter, referred to as "$FA_{1-x}PEA_xSnI_3$") will be described.

First, the fluorine compound is added to a first organic solvent to provide a first solution. An example of the first organic solvent is an alcohol such as butanol, an ether such as diethyl ether, a lactone, an alkyl sulfoxide such as dimethyl sulfoxide (hereinafter referred to as "DMSO"), or an amide such as N, N-dimethylformamide (hereinafter referred to as "DMF"). Two or more kinds of the first organic solvents may be mixed to be used.

Next, the first solution is applied on the intermediate layer 7 by a spin-coat method to form an application film. The formed application film is heated at temperature of not less than 75 degrees Celsius and not more than 85 degrees Celsius for not less than 25 minutes and not more than 35 hours with a heater such as a hot plate. In this way, a fluorine compound layer is formed. A part of the first solution enters the inside of the intermediate layer 7 formed of the porous body; and other part of the first solution is formed on the intermediate layer 7, and then, solidified to be the fluorine compound layer covering the upper surface of the intermediate layer 7. The fluorine compound layer may have a thickness of not less than 5 nanometers and not more than 15 nanometers.

Next, $SnI_2$, $SnF_2$, $HC(NH_2)_2I$ (hereinafter, referred to as "FAI"), and $C_6H_5CH_2CH_2NH_3I$ (hereinafter, referred to as "PEAI") are added to a second organic solvent to provide a second solution. An example of the second organic solvent is a mixture liquid of DMSO and DMF (the volume ratio of DMSO:DMF=1:1).

The molar concentration of $SnI_2$ may be not less than 0.8 mol/L and not more than 2.0 mol/L, or not less than 0.8 mol/L and not more than 1.5 mol/L.

The molar concentration of $SnF_2$ may be not less than 0.01 mol/L and not more than 1.0 mol/L, or not less than 0.01 mol/L and not more than 0.5 mol/L.

The molar concentration of FAI may be not less than 0.8 mol/L and not more than 2.0 mol/L, or not less than 0.8 mol/L and not more than 1.5 mol/L.

The molar concentration of PEAI may be not less than 0.1 mol/L and not more than 0.3 mol/L, or not less than 0.1 mol/L and not more than 0.5 mol/L.

Next, the second solution is heated with the heater to a temperature of not less than 40 degrees Celsius and not more than 180 degrees Celsius. In this way, a mixture solution in which $SnI_2$, $SnF_2$, FAI, and PEAI have been dissolved is provided. Subsequently, the provided mixture solution is left at rest at room temperature.

The mixture solution is applied on the fluorine compound layer by a spin-coat method to form an application film. Then, the application film is heated at temperature of not less than 40 degrees Celsius and not more than 100 degrees Celsius for not less than 15 minutes and not more than 1 hour. In this way, the light-absorbing layer 3 is provided. In a case where the mixture solution is applied by a spin-coat method, drops of a poor solvent may be put during the spin-coat. An example of the poor solvent is toluene, chlorobenzene, or diethyl ether. The fluorine compound included in the fluorine compound layer (e.g., $SnF_2$) is dissolved or dispersed in the mixture solution. For this reason, in the mixture solution applied on the fluorine compound layer, a concentration gradient of the fluorine compound is formed.

As a result, the concentration gradient of the fluorine compound is formed in the light-absorbing layer 3 in such a manner that the concentration of the fluorine compound is decreased in a direction from a lower part of the light-absorbing layer 3 to an upper part of the light-absorbing layer 3 (namely, in a direction from the intermediate layer 7 to the second electrode 4). In other words, the concentration of the fluorine compound is high in the lower part of the light-absorbing layer 3, whereas the concentration of the fluorine compound is low in the upper part of the light-absorbing layer 3. In this way, at the interface 3a, the molar ratio of the fluorine atoms to the perovskite compound represented by the chemical formula $ASnX_3$ is increased.

The second solution may contain a quencher material such as tin fluoride. The quencher material may have a concentration of not less than 0.05 mol/L and not more than 0.4 mol/L. The quencher material prevents defects from being generated in the light-absorbing layer 3. The reason why the defect is generated in the light-absorbing layer 3 is, for example, that the amounts of Sn vacancies are increased due to the increase in the amount of $Sn^{4+}$.

The hole transport layer 6 is formed on the light-absorbing layer 3. An example of the formation method of the hole transport layer 6 is an application method or a printing method. An example of the application method is a doctor blade method, a bar coating method, a spray method, a dip coating method, or a spin-coat method. An example of the printing method is a screen printing method. A plurality of the materials may be mixed to provide the hole transport layer 6, and then, the hole transport layer 6 may be pressurized or sintered. In a case where the hole transport layer 6 is formed of an organic low molecular material or an inorganic semiconductor, the hole transport layer 6 may be formed by a vacuum deposition method.

Next, the second electrode 4 is formed on the hole transport layer 6. In this way, the solar cell 100 is provided. The second electrode 4 may be formed by a chemical vapor deposition method or by a sputtering method.

Second Embodiment

Figure 2:
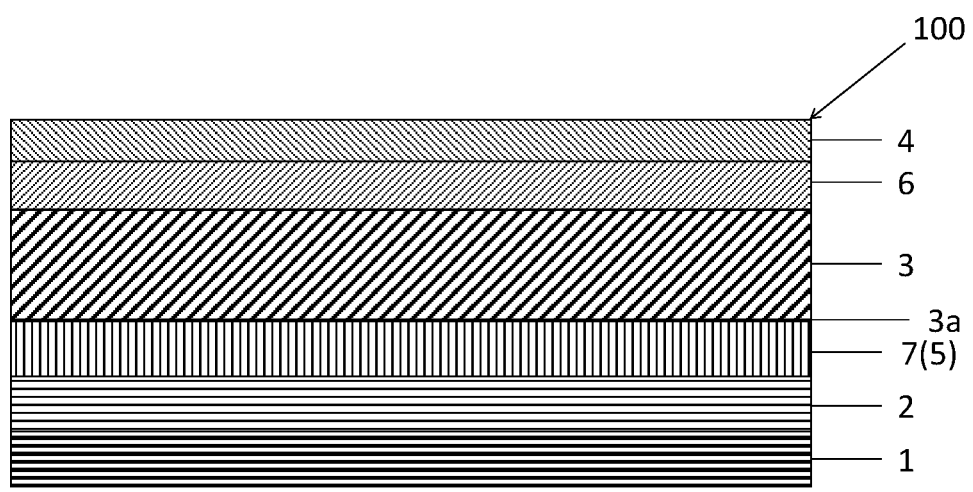
FIG. 2 shows a cross-sectional view of the solar cell according to the second embodiment of the present disclosure.

FIG. 2 shows a cross-sectional view of the solar cell 100 according to the second embodiment. In the second embodiment, the intermediate layer 7 is the electron transport layer 5 formed of a dense layer. In other words, the electron transport layer 5 doubles as the intermediate layer 7. In the second embodiment, the electron transport layer 5 is formed of the metal oxide. It is desirable that the electron transport layer 5 which doubles as the intermediate layer 7 is formed of $TiO_2$.

EXAMPLES

The present disclosure will be described in more detail with reference to the following examples.

Inventive Example 1

(Production of Perovskite Solar Cell)

In the inventive example 1, the perovskite solar cell 200 shown in FIG. 1 was produced as below.

A glass substrate having a $SnO_2$ layer doped with indium on the surface thereof was prepared. The glass substrate was a product of Nippon Sheet Glass Company, Ltd. The glass substrate and the $SnO_2$ layer served as the substrate 1 and the first electrode 2. The glass substrate had a thickness of 1 millimeter.

A titanium oxide layer having a thickness of approximately 10 nanometers was formed as the electron transport layer 5 on the first electrode 2 by a sputtering method.

Highly pure titanium oxide powder having a mean primary particle diameter of 30 nanometers was dispersed in ethyl cellulose to prepare a titanium oxide paste.

The prepared titanium oxide paste was applied to the electron transport layer 5 by a screen printing method, and then, dried. Subsequently, the titanium oxide paste was sintered in air at temperature of 500 degrees Celsius for 30 minutes to form the intermediate layer 7 formed of a porous titanium oxide layer having a thickness of 200 nanometers.

Next, in a globe box filled with $N_2$, while droplets of DMSO solution (80 microliters) containing $SnF_2$ was put onto the intermediate layer 7, the DMSO solution was applied on the intermediate layer 7 by a spin-coat method to form an application film. The globe box had an oxygen concentration of not more than 0.1 ppm. The DMSO solution had a $SnF_2$ concentration of 0.1 mol/L. The application film was heated on a hot plate maintained at 80 degrees Celsius to form a layer containing $SnF_2$ (namely, the fluorine compound layer). The pore of the porous titanium oxide included $SnF_2$ partially.

Next, $SnI_2$, $SnF_2$, FAI (i.e., $HC(NH_2)_2I$), and PEAI (i.e., $C_6H_5CH_2CH_2NH_3I$) were added to a mixture solvent of DMSO and DMF to provide a mixture solution. A volume ratio of DMSO:DMF in the mixture solvent was 1:1. The concentration of $SnI_2$, $SnF_2$, FAI, and PEAI were 1.5 mol/L, 0.15 mol/L, 1.5 mol/L, and 0.3 mol/L, respectively.

In a globe box, the mixture solution (80 microliters) was applied on the fluorine compound layer by a spin-coat method to provide an application film having a thickness of 300 nanometers. Then, the application film was heated on the hot plate at 80 degrees Celsius. In this way, the light-absorbing layer 3 having a thickness of 300 nanometers was formed. The light-absorbing layer 3 contained the perovskite compound of the chemical formula $FA_{0.83}PEA_{0.17}SnI_3$ mainly.

Next, in the globe box, a toluene solution (80 microliters) containing PTAA (i.e., poly[bis(4-phenyl)(2,4,6-trimethylphenyl)amine]) at a concentration of 10 milligrams/milliliter was applied on the light-absorbing layer 3 by a spin-coat method to form the hole transport layer 6 having a thickness of 10 nanometers.

Finally, a gold film having a thickness of 100 nanometers was deposited on the hole transport layer 6 to form the second electrode 4. In this way, the tin-perovskite solar cell according to the inventive example 1 was provided.

(Measurement of Molar Ratio)

With regard to the solar cell according to the inventive example 1, the molar ratio of the fluorine atoms to the perovskite compound at the interface 3a between the light-absorbing layer 3 and the intermediate layer 7 was measured by the following method.

First, while the light-absorbing layer 3 was etched from the second electrode 4 along a thickness direction of the light-absorbing layer 3, the elemental composition of the etched light-absorbing layer 3 was measured by an X-ray photoelectron spectroscopy method with an X-ray photoelectron spectroscopy measurement device (product of ULVAC-PHI, Inc., trade name: PHI 5000 VersaProbe).

As shown in FIG. 3, a hole 3h having a depth of d1 was formed in the light-absorbing layer 3 by the etching. The composition of the elements included in an interval d2 was measured with the X-ray photoelectron spectroscopy measurement device. The interval d2 is a distance between the bottom b1 of the hole 3h and a position b2 located more deeply than the bottom b1. The interval d2 (namely, the depth d2) was 10 nanometers in the X-ray photoelectron spectroscopy measurement device used in the present examples. In other words, the X-ray photoelectron spectroscopy measurement device used in the present examples had a spectroscopic capability of 10 nanometers.

The etching was conducted by a sputtering method using argon.

The source of the X-ray was Al.

The X-ray was monochromatic light.

The output of the X-ray was 24.8 W.

Using the measured elementary composition, the molar ratio of the fluorine atoms to the perovskite compound at the depth d1 was calculated on the following mathematical formula (2).

$$\text{Molar ratio} = (\text{the number of the moles of the fluorine atoms in the interval } d2)/\{(\text{the number of the moles of iodide ions included in the perovskite compound contained in the light-absorbing layer 3})/3\} \quad (2)$$

As above mentioned, the light-absorbing layer 3 had a thickness of 300 nanometers. Therefore, the molar ratio in a case where the depth d1 is equal to 300 nanometers is a molar ratio of the fluorine atoms to the perovskite compound at the interface 3a between the light-absorbing layer 3 and the intermediate layer 7.

(Measurement of Conversion Efficiency)

The solar cell according to the inventive example 1 was irradiated with pseudo sunlight having an illumination intensity of 100 $mW/cm^2$ with a solar simulator to measure the conversion efficiency of the solar cell according to the inventive example 1.

Inventive Example 2

In the inventive example 2, the experiment similar to the inventive example 1 was performed, except for the following matter (i).

(i) The DMSO solution containing $SnF_2$ had a $SnF_2$ concentration of 0.3 mol/L.

Inventive Example 3

In the inventive example 3, the experiment similar to the inventive example 1 was performed, except for the following matter (i).

(i) The DMSO solution containing $SnF_2$ had a $SnF_2$ concentration of 0.7 mol/L.

Inventive Example 4

In the inventive example 4, the experiment similar to the inventive example 1 was performed, except for the following matter (i).

(i) The DMSO solution containing $SnF_2$ had a $SnF_2$ concentration of 1.0 mol/L.

Comparative Example 1

In the comparative example 1, the experiment similar to the inventive example 1 was performed, except for the following matter (i).

(i) The droplets of the DMSO solution containing $SnF_2$ was not put on the intermediate layer 7.

Table 1 and Table 2 show the results provided in the inventive examples 1-4 and the comparative example 1. In Table 1 and Table 2, the word "I.E." means the inventive example. The word "C.E." means the comparative example.

TABLE 1

| Depth d1 | Molar ratio of Fluorine Atoms to Perovskite Compound at Depth d1(%) | | | | |
|---|---|---|---|---|---|
| (nm) | I.E. 1 | I.E. 2 | I.E. 3 | I.E. 4 | C.E. 1 |
| 0 | 2.10 | 4.10 | 5.01 | 14.8 | 5.2 |
| 23.1 | 12.6 | 14.9 | 7.60 | 15.8 | 7.3 |

TABLE 1-continued

| Depth d1 | Molar ratio of Fluorine Atoms to Perovskite Compound at Depth d1(%) | | | | |
|---|---|---|---|---|---|
| (nm) | I.E. 1 | I.E. 2 | I.E. 3 | I.E. 4 | C.E. 1 |
| 115.4 | 13.7 | 17.7 | 18.0 | 14.7 | 13.5 |
| 207.7 | 15.9 | 19.1 | 18.1 | 19.3 | 18.8 |
| 300.0 | 50.2 | 57.9 | 66.3 | 70.6 | 48.1 |

TABLE 2

| | I.E. 1 | I.E. 2 | I.E. 3 | I.E. 4 | C.E. 1 |
|---|---|---|---|---|---|
| Conversion Efficiency (%) | 4.11 | 4.34 | 4.16 | 3.96 | 3.68 |

As is clear from Table 1 and Table 2, the molar ratio was increased with an increase in the $SnF_2$ concentration in the DMSO solution.

Since the solar cells according to the inventive examples 1-4 had a molar ratio at the interface 3a of not less than 0.49 (namely, since the molar ratio at the depth d1 of 300 nanometers is not less than 0.49), the solar cells according to the inventive examples 1-4 had higher conversion efficiency than the solar cell according to the comparative example 1.

The present inventors believe that Sn vacancies included in the perovskite compound contained in the light-absorbing layer 3 were substituted with $SnF_2$ to improve the conversion efficiency in the solar cells according to the inventive examples 1-4.

On the other hand, as is clear from comparison of the inventive examples 1-2 to the inventive example 3-4, the conversion efficiency is decreased with a significant increase in the molar ratio at the interface 3a.

The present inventors believe that the reason for the decrease in the conversion efficiency is that (i) $SnF_2$ is insulative, and (ii) that $SnF_2$ prevents the electrons and the holes from migrating in the light-absorbing layer 3.

As is clear from Table 1 and Table 2, if the molar ratio at the interface 3a is not less than 0.502 and not more than 0.663, the solar cell had a significantly high conversion efficiency of not less than 4.11%.

INDUSTRIAL APPLICABILITY

The solar cell according to the present disclosure is disposed, for example, on a roof.

REFERENTIAL SIGNS LIST

1 Substrate
2 First electrode
3 Light-absorbing layer
3a Interface
4 Second electrode
5 Electron transport layer
6 Hole transport layer
7 Intermediate layer
100 Solar cell

The invention claimed is:
1. A solar cell, comprising:
a first electrode having a light-transmissive property;
a second electrode;
a light-absorbing layer located between the first electrode and the second electrode; and
an intermediate layer located between the first electrode and the light-absorbing layer, wherein
the light-absorbing layer contains a fluorine compound and a perovskite compound which is represented by a chemical formula $ASnX_3$, where A is a monovalent cation and X is a halogen anion;
the intermediate layer contains at least one selected from the group consisting of a metal oxide, a metal sulfide, a metal chalcogenide, and a metal nitride;
an upper surface of the intermediate layer is in contact with a lower surface of the light-absorbing layer; and
a molar ratio of fluorine atoms to the perovskite compound is not less than 49% and not more than 75% at an interface between the light-absorbing layer and the intermediate layer.
2. The solar cell according to claim 1, wherein
the intermediate layer is formed of a porous body.
3. The solar cell according to claim 2, wherein
at least one selected from the group consisting of the perovskite compound and the fluorine compound is contained in an inside of the porous body.
4. The solar cell according to claim 1, wherein
the intermediate layer serves as an electron transport layer.
5. The solar cell according to claim 1, wherein
the molar ratio is not less than 50.2% and not more than 66.3%.
6. The solar cell according to claim 1, wherein
the fluorine compound is $SnF_2$.
7. The solar cell according to claim 1, further comprising:
a hole transport layer located between the second electrode and the light-absorbing layer.
8. The solar cell according to claim 1, wherein
the halogen anion is an iodide ion.
9. The solar cell according to claim 1, wherein
the intermediate layer has a thickness of not less than 0.01 micrometer and not more than 10 micrometers.
10. The solar cell according to claim 1, wherein
the light-absorbing layer contains 70 mass percent or more of the perovskite compound.
11. The solar cell according to claim 1, wherein the light-absorbing layer contains 80 mass percent or more of the perovskite compound.
12. The solar cell according to claim 1, wherein
the intermediate layer is formed of a metal oxide.
13. The solar cell according to claim 1, wherein
the intermediate layer is formed of $TiO_2$.
14. The solar cell according to claim 1, wherein
the intermediate layer has a surface roughness coefficient of not less than 10.
15. The solar cell according to claim 1, wherein
the molar ratio of fluorine atoms to the perovskite compound is not more than 14.8% at a lower surface of the intermediate layer.

* * * * *